United States Patent [19]

Smith et al.

[11] Patent Number: 5,079,596

[45] Date of Patent: Jan. 7, 1992

[54] SCHOTTKY DIODE

[76] Inventors: Robin Smith, 2 Flamband Rd., Harrow, Middlesex HA1 2NA, England; Peter Wennekers, Kirchstrasse 47, D-7800 Freiburg, Fed. Rep. of Germany

[21] Appl. No.: 353,643
[22] PCT Filed: Aug. 6, 1988
[86] PCT No.: PCT/DE88/00487
§ 371 Date: Apr. 5, 1989
§ 102(e) Date: Apr. 5, 1989
[87] PCT Pub. No.: WO89/02162
PCT Pub. Date: Mar. 9, 1989

[30] Foreign Application Priority Data

Aug. 22, 1987 [DE] Fed. Rep. of Germany ....... 3728135

[51] Int. Cl.$^5$ .................. H01L 29/48; H01L 29/56; H01L 29/64; H01L 23/48
[52] U.S. Cl. .................................... 357/15; 357/71; 437/175; 437/176; 437/177; 437/184; 437/904
[58] Field of Search ............... 357/15, 71; 437/175, 437/176, 177, 184, 904

[56] References Cited

U.S. PATENT DOCUMENTS

| | | |
|---|---|---|
| 4,394,673 | 7/1983 | Thompson et al. .......... 357/15 |
| 4,803,539 | 2/1989 | Psaras et al. .......... 357/15 |
| 4,847,675 | 7/1989 | Eng .......... 357/71 |

FOREIGN PATENT DOCUMENTS 0048849  9/1981  European Pat. Off. ........... 357/15

OTHER PUBLICATIONS

Waldrop, "Rare Earth Metal Schottky-Barrier Contact to GaAs", May 1985, pp. 864-866.
Journal of the Physical Society of Japan, Band 42, Nr. 2, Feb. 1977, Tokyo, JP, A. Hasegawa et al., "Energy Band Structures of Gd-Pnictides", pp. 492-498.
J. Phys. C: Solid St. Phys., Band 13, 1980, The Institute of Physics, (London, GB), A. Hasegawa, "Electronic Structure of La Monopnictides", pp. 6147-6156.
Applied Physics Letters, Band 46, Nr. 9, 1 May 1985, American Institute of Physics, (Woodbury, N.Y., US), J. R. Waldrop: "Rare-Earth Metal Schottky-Barrier Contacts to GaAs", pp. 864-866.

Primary Examiner—Andrew J. James
Assistant Examiner—Daniel Kim

[57] ABSTRACT

A schottky diode consists of a substrate from gallium-/arsenide (5) on which epitaxially a monocrystalline gallium/arsenide layer (6) doped with silicium is applied. For creating the Schottky contact, a monocrystalline erbium/arsenide layer or ytterbium/arsenide layer (7) is epitaxially applied on this layer. Following as a covering layer is a highly doped gallium/arsenide layer (8).

20 Claims, 1 Drawing Sheet

SCHOTTKY DIODE

BACKGROUND OF THE INVENTION

The invention relates to a Schottky diode having a substrate layer made from gallium arsenide. A thin gallium arsenide layer is located on the side of the substrate facing away from the metallized connecting contact surface. Another layer is applied on this thin gallium arsenide layer to form a Schottky contact, which is further provided with a second metallized connecting contact surface.

Diodes of the Schottky type are known in the art and include a layer made from indium tin oxide ($InSnO_2$) as the layer forming the Schottky contact. The indium tin oxide layer, which is not monocrystalline, is applied, for instance, after the epitaxial application of the thin gallium arsenide layer in a molecular beam epitaxy system using a separate apparatus, for instance, by sputtering or vaporization. A disadvantage with this is that changing the equipment exposes the still unfinished components to damage. Further, the equipment change makes the manufacturing process more time consuming and thus more expensive.

Based on this prior art, the problem underlying the invention is to provide a Schottky diode of the aforementioned type which can be manufactured in a simple manner by using a high yield system and process, and which is distinguished from the prior art by high efficiency.

SUMMARY OF THE INVENTION

This problem is inventionally solved in that the thin layer forming the Schottky contact is a monocrystalline layer from a monopnictide. Preferably, erbium arsenide or ytterbium arsenide is used as the monopnictide, which is applied using the same molecular beam epitaxy system as for the thin gallium arsenide layer.

Since the layer made from erbium arsenide or ytterbium arsenide is monocrystalline and not polycrystalline, more uniform conditions of conductivity and a more favorable reflective performance of the Schottky diode for light are obtained when using it as a photodetector. The more uniform conductivity results in a better efficiency. Since the inventional Schottky diode can be manufactured in a system without interruption of the manufacturing process, there is a high yield obtained with no risk of contamination in transporting the semifinished components from one system to another for subsequent process steps.

Suitable designs and advancements of the invention are set forth in the dependent claims.

BRIEF DESCRIPTION OF THE DRAWING

An embodiment of the invention will be more fully explained hereafter with the aid of the drawing, which comprises one FIGURE.

The drawing depicts a schematic perspective view of a Schottky diode that can be used as photodetector and whose thickness, for illustration purposes, is shown exaggerated in size as compared to its other dimensions.

DETAILED DESCRIPTION OF THE PREFERRED EMBODIMENT

Figure 1:
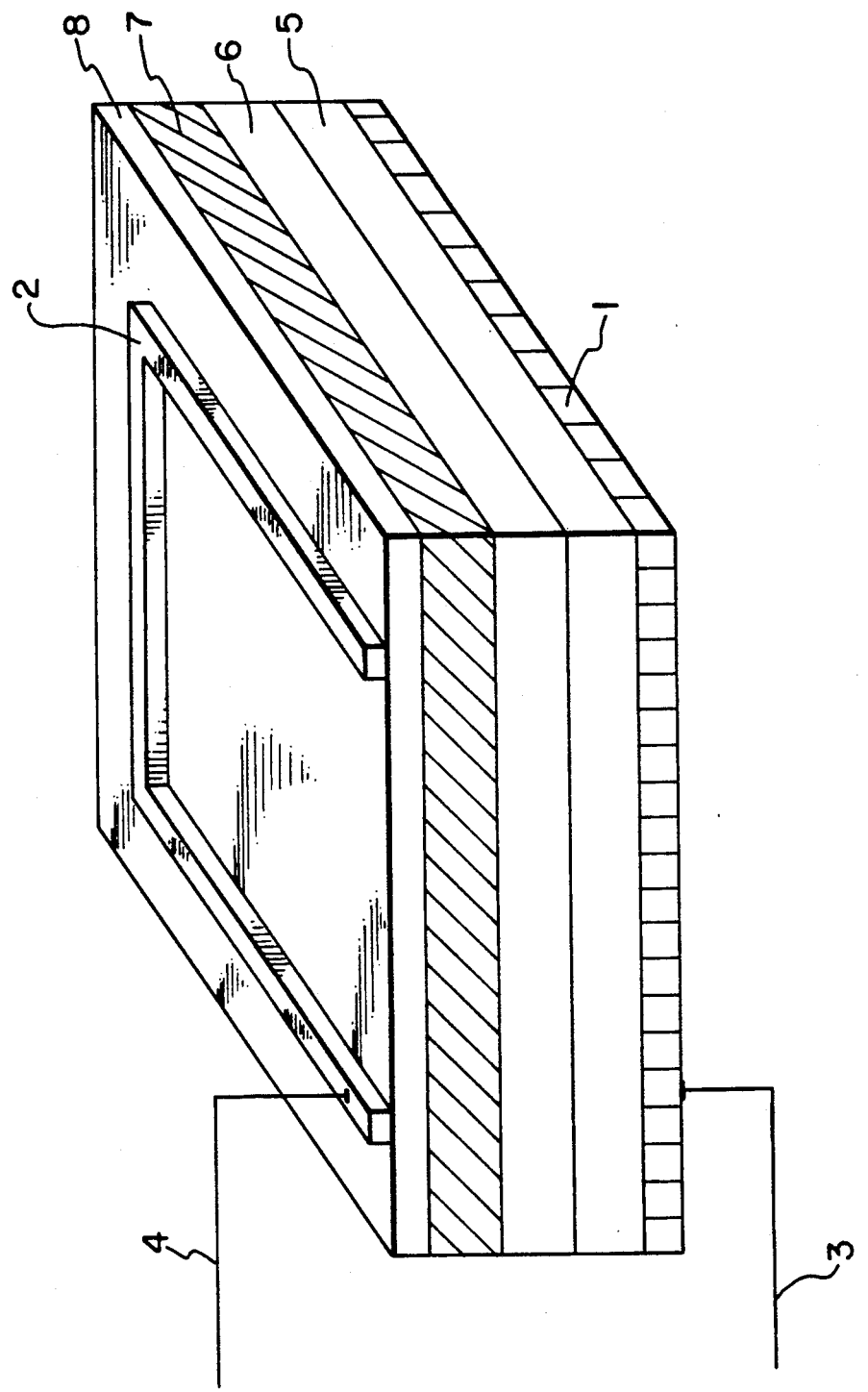

On the Schottky diode illustrate in the drawing, the first connecting electrode is designed as a large-area metal electrode 1. The second connecting electrode, which when used as a photodetector is located on the side of the light incidence, is fashioned as U-shaped metal contact strip 2. The large-area metal electrode 1 is connected in customary fashion with a contact wire 3, and the metal contact strip 2 is connected with a contact wire 4.

The large-area metal electrode 1 is located on the underside of a substrate 5, which is made from electrically conductive gallium arsenide doped with silicon. Grown on the substrate 5 from gallium arsenide, epitaxially, is a thin monocrystalline gallium arsenide layer 6 of low electrical conductivity. As with substrate 5, monocrystalline gallium arsenide layer 6 also contains silicon impurity.

The next layer in the laminate sequence of the Schottky diode consists of a thin layer 7 made from erbium arsenide or ytterbium arsenide that is grown in place of a monocrystalline. For light with a wavelength of less than 1 um, this layer has the property of being entirely transparent, so that a transparent Schottky contact is formed. Resulting from the monocrystalline structure is a uniform conductivity and a favorable reflective performance at light incidence. Thus, the uniform conductivity results in an especially good efficiency. The layer 7 made from erbium arsenide or ytterbium arsenide represents an electrically highly conductive layer which permits the creation of a Schottky contact. It can be grown in place epitaxially, monocrystalline, on gallium arsenide and permits the application of another, very thin highly electrically conductive gallium arsenide layer 8, as a cover layer on the layer 7, thereby creating a monocrystalline sequence of layers starting from a gallium arsenide layer, then a highly conductive layer, and finally a gallium arsenide layer.

The Schottky diode is manufactured using a molecular beam epitaxy system and a process in which the component need not be introduced in a separate apparatus during its manufacture.

In manufacturing the Schottky diode, the substrate 5, which is a flat gallium arsenide disk, is mounted in a molecular beam epitaxy system (MBE system) on a heated disk holder. The substrate 5 is heated to 550°-600° C. under vacuum. Heated simultaneously are four crucibles provided in the MBE system, which contain arsenic, gallium, silicium and the lanthanide that is used, i.e., for instance ytterbium or erbium. As usual, the four crucibles are provided with lids which can be opened and closed for control of the manufacturing process.

At the beginning of the manufacturing process, the arsenide crucible is opened, thereafter the gallium crucible and finally the silicon crucible. The monocrystalline gallium arsenide layer 6 forms as the vapor issuing from the crucibles condenses on the surface of the substrate 5. The silicon furnished by one of the crucibles is incorporated in the monocrystalline gallium arsenide layer 6 as an impurity atom, making the monocrystalline gallium arsenide layer 6 electrically conductive. The electrical conductivity can be adjusted as desired, by temperature adjustment in heating the crucible containing the silicon. The thickness of the gallium arsenide layer 6 is determined by the amount of time that the lid of the crucible containing the gallium is open. The various parameters of the manufacturing process are selected so that a thin monocrystalline gallium arsenide layer 6 with a low electrical conductively will be grown. Once the desired thickness has been reached, the lids of the crucibles containing silicon and gallium are closed.

Following the opening of the lanthanide crucible, the ytterbium or erbium contained therein evaporates slowly, with a monocrystalline epitaxial ytterbium arsenide or erbium arsenide layer forming on the gallium arsenide layer 6. If other lanthanides are used, rather than the mentioned lanthanides, other monopnictides will form correspondingly.

The rate of growth of the layer 7 depends on the temperature of the coordinated crucible and, thus, can be influenced by temperature selection. The epitaxial process is ended as soon a thin monocrystalline layer 7 with a thickness of about 10 to 100 angstroms has been created. To that end, the lanthanide crucible is closed.

Next, the gallium crucible of the MBE system is opened first, and thereafter the silicon crucible of the MBE system. This forms the very thin and highly electrically conductive gallium arsenide layer 8, which serves as a cover layer. The gallium arsenide layer 8 is epitaxially grown in place, monocrystalline, on the monocrystalline layer 7 from ytterbium or erbium.

Following the application of the gallium arsenide layer 8, which serves to protect the layer 7, the substrate 5, after being treated in the described fashion, can be removed from the MBE system. All that is then required is to vaporize the large-area metal electrode 1 and the metal contact strip 2 in place, with the aid of a metal vaporization system, and connect the vaporized metal layers with the contact wires 3 and 4. The component produced is then introduced into a housing in known fashion, where in the case of using the described Schottky diode as a light detector, there is a light incidence window provided on the side of the metal contact strip 2.

We claim:

1. A Schottky diode having a first metallized contacting surface and a substrate made from gallium arsenide which on the side facing away from the first metallized connecting contact surface includes a thin gallium arsenide layer on which a thin monopnictide layer is applied that forms a Schottky contact and is provided with a second metallized connecting contact surface.

2. The Schottky diode according to claim 1, wherein said thin monopnictide layer has a thickness of about 10 to 100 angstroms.

3. The Schottky diode according to claim 1, wherein a very thin cover layer is located on said thin monopnictide layer, from cover layer made from gallium arsenide doped with silicon which supports the second metallized connecting contact surface of the Schottky diode.

4. The Schottky diode according to claim 1, wherein the thin monocrystalline gallium arsenide layer grown onto the substrate is doped with silicon to cause the thin gallium arsenide layer to have a relatively low electrical conductivity.

5. The Schottky diode according to claim 1, wherein said thin monopnictide layer is erbium arsenide.

6. The Schottky diode according to claim 1, wherein said thin monopnictide layer is ytterium arsenide.

7. The Schottky diode according to claim 1, wherein said thin monopnictide layer is cerium arsenide, prasedoymium arsenide, neodymium arsenide, promethium arsenide, samarium arsenide, europium arsenide, gadolinium arsenide, terbium arsenide, dysprosium arsenide, holmium arsenide, thulium arsenide or lutetium arsenide.

8. The Schottky diode according to claim 1, wherein said thin monophictide layer forming the Schottky contact comprises monopnictides formed with various lanthanides.

9. The Schottky diode according to claim 1, wherein the Schottky diode constitutes a photodiode whose second metallized connecting contact surface is formed by metal contact strips.

10. A Schottky diode having with a first metallized connecting contact surface and a substrate made of gallium arsenide which on the side facing away from the first metallized connecting contact surface includes a thin gallium arsenide layer on which a thin monopnictide layer which is grown in place epitaxially is applied that forms a Schottky contact and is provided with a second metallized connecting contact surface, a very thin cover layer formed on said monopnictide layer and formed of gallium arsenide doped with silicon, said very thin cover layer supporting the second metallized connecting contact surface of the Schottky diode.

11. The Schottky diode according to claim 10 wherein the thin monocrystalline gallium arsenide layer grown onto the substrate is doped with silicon to cause the thin gallium arsenide layer to have a relatively low electrical conductivity.

12. The Schottky diode according to claim 10 wherein said thin monopnictide layer is erbium arsenide.

13. The Schottky diode according to claim 10 wherein said thin monopnictide layer is ytterbium arsenide.

14. The Schottky diode according to claim 10 wherein said thin monopnictide layer is cerium arsenide, praseodymium arsenide, neodymium arsenide, promethium arsenide, samarium arsenide, europium arsenide, gadolinium arsenide, terbium arsenide, dysprosium arsenide, holmium arsenide, thulium arsenide or lutetium arsenide.

15. The Schottky diode according to claim 10 wherein said thin monopnictide layer forming the Schottky contact comprises monopnictides formed with various lanthanides.

16. The Schottky diode according to claim 10 wherein the Schottky diode constitutes includes a photodiode whose second metallized connecting contact surface is formed of metal contact strips.

17. A Schottky diode having a first metallized connecting contact surface and a substrate made from gallium arsenide which on the side facing away from the first metallized connecting contact surface includes a thin gallium arsenide layer on which a thin monopnictide layer is applied that forms a Schottky contact and is provided with a second metallized connecting contact surface, said thin gallium arsenide layer being doped with silicon to cause the layer to have relatively low electrical conductivity, a very thin cover layer applied on said monopnictide layer and formed of gallium arsenide doped with silicon and supporting the second metallized connecting contact surface of the Schottky diode.

18. The Schottky diode according to claim 17 wherein said thin monopnictide layer is erbium arsenide.

19. The Schottky diode according to claim 17 wherein the Schottky diode constitutes a photodiode whose second metallized connecting contact surface is formed of metal contact strips.

20. A Schottky photo diode comprising:
a first metallized contacting surface;

a substrate made from gallium arsenide, said substrating having a first surface contacting said first metallized contacting surface and an opposite second surface facing away from said first surface;
a thin gallium arsenide layer formed on said second surface;
a thin monopnictide layer formed on said thin gallium arsenide layer to form a transparent Schottky contact; and
a second metallized contacting surface located on said monopnictide layer.

* * * * *